United States Patent
Chu et al.

[11] Patent Number: 5,554,563
[45] Date of Patent: Sep. 10, 1996

[54] IN SITU HOT BAKE TREATMENT THAT PREVENTS PRECIPITATE FORMATION AFTER A CONTACT LAYER ETCH BACK STEP

[75] Inventors: Po-Tao Chu, Taoyuan; Kuang-Hui Chang; Yuan-Chang Huang, both of Hsin-Chu, all of Taiwan

[73] Assignee: Taiwan Semiconductor Manufacturing Company, Hsin-Chu, Taiwan

[21] Appl. No.: 416,163

[22] Filed: Apr. 4, 1995

[51] Int. Cl.$^6$ .................................. H01L 21/28
[52] U.S. Cl. .................. 437/190; 437/192; 437/228; 437/247
[58] Field of Search ..................... 437/190, 192, 437/200, 194, 247, 228

[56] References Cited

U.S. PATENT DOCUMENTS

| | | | |
|---|---|---|---|
| 4,561,907 | 12/1985 | Raicu | 148/1.5 |
| 4,951,601 | 8/1990 | Maydan et al. | 118/719 |
| 5,164,330 | 11/1992 | Davis et al. | 437/192 |
| 5,174,816 | 12/1992 | Aoyama | 216/102 |
| 5,227,337 | 7/1993 | Kadomura | 437/192 |
| 5,254,498 | 10/1993 | Sumi | 437/190 |
| 5,326,723 | 7/1994 | Petro et al. | 437/192 |
| 5,347,696 | 9/1994 | Willer et al. | 29/25.42 |
| 5,391,244 | 2/1995 | Kadomura | 156/662 |

*Primary Examiner*—John Niebling
*Assistant Examiner*—Thomas G. Bilodeau
*Attorney, Agent, or Firm*—George O. Saile; William J. Stoffel

[57] ABSTRACT

A process for preventing the formation of precipitates on a substrate surface containing titanium after a contact layer (e.g., tungsten layer) etch back. The process involves removing the precursor chemicals of the precipitate. With the invention, the precursor are removed by baking the substrate at a temperature of approximately 120° C. for approximately 80 seconds. Preferably, the baking process is performed in situ by a halogen lamp mounted on the exit loading dock of the etcher thereby not impacting the wafer throughput of the etcher.

23 Claims, 2 Drawing Sheets

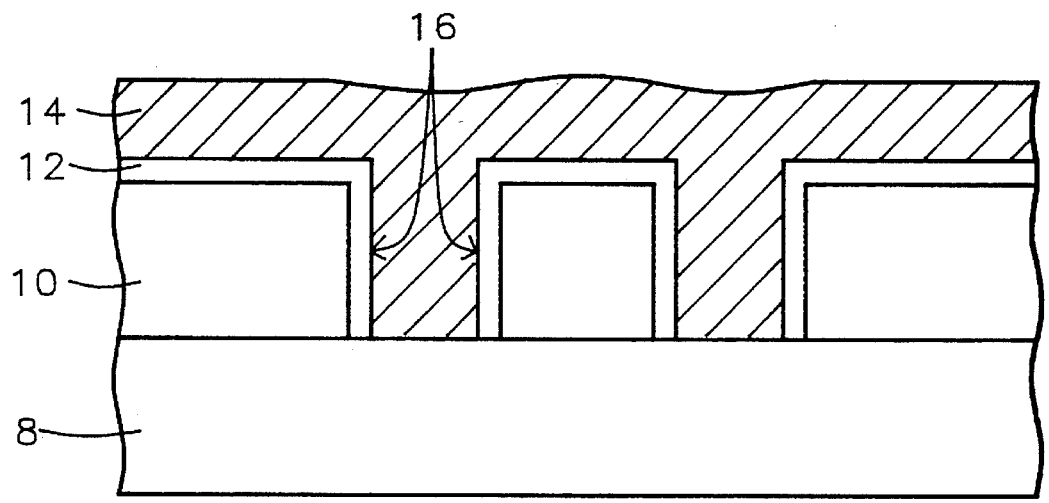
*FIG. 1 - Prior Art*
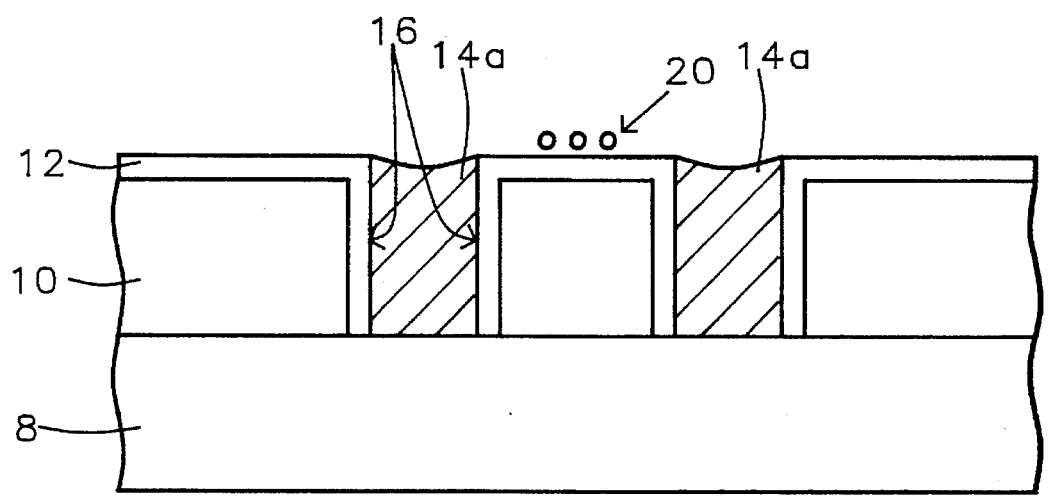
*FIG. 2 - Prior Art*

IN SITU HOT BAKE TREATMENT THAT PREVENTS PRECIPITATE FORMATION AFTER A CONTACT LAYER ETCH BACK STEP

BACKGROUND OF THE INVENTION

1) Field of the Invention

The present invention relates to the field of semiconductor fabrication and more particularly to metal-oxide-semiconductor (MOS) fabrication and to a process for preventing the formation of precipitates on a substrate surface after a contact layer is subjected to an etch back step.

2) Description of the Prior Art

In the manufacture of semiconductor devices, it is normally necessary to make electrical contact to device regions on the substrate surface through an overlying dielectric layer. This is accomplished by first forming an opening or via (contact via) in the dielectric layer over the region to be electrically contacted, and next filling the contact via with a conductive material.

In addition to filling the vias with a conductive material, it is necessary to electrically connect certain device regions with others, as well as to provide for electrical connection to external leads. These requirements are met by forming a wiring layer on the surface of the substrate. The wiring layers are formed by depositing a conductive material on top of the dielectric layer in which vias have been formed. The conductive layer is then masked and etched to leave continuous lines of conducive material necessary to match the appropriate connections to the device regions of the substrate. These lines are known as interconnects.

Several conductive materials can be used as contact via fill. In larger geometry devices, the via fill and interconnect are formed simultaneously using one conductive layer. For example, aluminum (Al) can be deposited on the entire substrate, as well as in the vias in one deposition step. The areas over the vias and interconnects are then masked with photoresist and the aluminum is etched from the exposed remaining areas, leaving the vias filled with aluminum as well as forming interconnect lines on the surface of the dielectric layer.

As device geometries have shrunk to submicron levels and devices have become more densely packed on the substrate surface, the aspect ratio (ratio of height to width) of the vias to the device regions has greatly increased. Using one aluminum deposition step to form both the via contacts (plug) and interconnect lines has proven to be inadequate in devices with high aspect ratios. Problems encountered include poor step coverage, poor contact integrity, and inadequate polarity. To overcome these shortcomings, tungsten and other refractory metals are being used as a contact filling (plugs) for devices with submicron contacts before aluminum deposition and patterning. For example, a blanket tungsten (W) is deposited. Next, a blanket etch back removes the deposited tungsten from the substrate surface, leaving a tungsten (W) filling or plug in the contact openings. The tungsten layer is etched back in a plasma etcher, such as in a LAM Research Equipment etcher model 4720. An aluminum layer is then deposited, covering the substrate surface including the filled contact vias. This aluminum film is then patterned and etched to form the interconnects lines between devices.

To improve the reliability of the interconnects and contacts, it has become a widely accepted practice to deposit a barrier metal layer such as TiN, TiW or the like within the contact hole and in surrounding areas. The barrier layer is formed over the dielectric layer and under the plug (e.g., W) and the interconnect layer (e.g., Al). The barrier layer can be formed by a sputter process. This barrier layer prevents undesirable reactions between the substrate material (e.g., Si) and the wiring material or between the dielectric layer (e.g., silicon oxide) or polysilicon and the wiring material (e.g., aluminum).

A problem with the current process of etching back a contact layer that is formed over a barrier layer containing titanium is that a precipitate often forms on the barrier layer. This precipitate, often violet in color, can cause circuit failure by interfering with the metal and insulation layer formed over the TiN and precipitate. The precipitate often appears to form a brown ring around the outside edge of the wafer. This precipitate can cause circuit failure by interfering with the metal and insulation layer formed over the precipitate and the barrier layer. Also, the precipitate can cause reliability problems, such as electro migration, metal peeling, and metal bridging. Many solutions have been tried without satisfactory success to eliminate this precipitation problem.

Therefore, there is a need for a process to remove or prevent the formation of precipitates after tungsten etch back. This process optimally should be simple, fast, and inexpensive to implement. It should also not reduce wafer throughput, especially on the etcher.

Davis, U.S. Pat. No. 5,164,330 teaches tungsten etch back process for tungsten layers using a $NF_3$/Ar chemistry with three etch steps. This process reduces the amount of residue buildup in the etching reactor.

Kadomura, U.S. Pat. No. 5,227,337 discloses a two step tungsten etch back process where the first step uses $S_2F_2$ gas at the high temperature and $S_2F_2/H_2$ at a low temperature.

Petro et al. U.S. Pat. No. 5,326,723 teaches a method of cleaning a CVD process chamber used to deposit tungsten. The chamber undergoes an in-situ cleaning process with $NF_3$ and $H_2N_2$ plasmas.

Sumi, U.S. Pat. No. 5,254,498 discloses a method of forming a barrier metal structure in a contact hole to ensure good metal coverage by the metal. The invention forms an oxide layer over a metal barrier layer (e.g., W) in a contact hole and forming a contact metal over the oxide.

Woo, U.S. Pat. No. 4,833,099 teaches a $N_2$ anneal after a tungsten deposition but before forming an oxidation layer over the tungsten layer. The $N_2$ anneal inhibits the tungsten from reacting with oxygen in the oxidation step and allows formation of a planar and uncontaminated oxide layer.

SUMMARY OF THE INVENTION

It is an object of this invention to provide a process to prevent formation of precipitates on the surface of a wafer after a contact layer etch back.

It is another object of the present invention to provide a process that prevents the formation of precipitates or remove the precursors of precipitates from the substrate surface containing titanium after a contact layer etch back.

It is another object of the present invention to provide a process that prevents the formation of precipitates from the substrate surface containing titanium after a contact layer etch back by performing an in situ bake process in an etcher and that does not reduce wafer throughput.

Accordingly, the present invention provide a process of preventing the formation of precipitates on a substrate surface after a tungsten contact layer etch back step. The method comprising depositing a titanium nitride barrier layer on the surface of the substrate. A contact layer is deposited on the surface of a semiconductor wafer. Next, the contact layer is etched back in an etcher exposing portions of the titanium nitride barrier layer. The substrate is heated with radiant heat until the surface temperature of the substrate is between 100° C. and 200° C. and maintaining the temperature for between 60 to 180 seconds. Preferably, the baking process is performed in situ by a halogen lamp mounted on the exit loading dock of the etcher thereby not impacting the wafer throughput of the etcher.

BRIEF DESCRIPTION OF THE DRAWINGS

The drawings show the following:

FIG. 1 shows a cross-sectional view of a wafer prior to contact layer etch back.

FIG. 2 shows a cross-sectional view of a wafer after the contact layer etch back and the formation of a precipitate on the substrate surface.

DETAILED DESCRIPTION OF THE PREFERRED EMBODIMENTS

Figure 3:
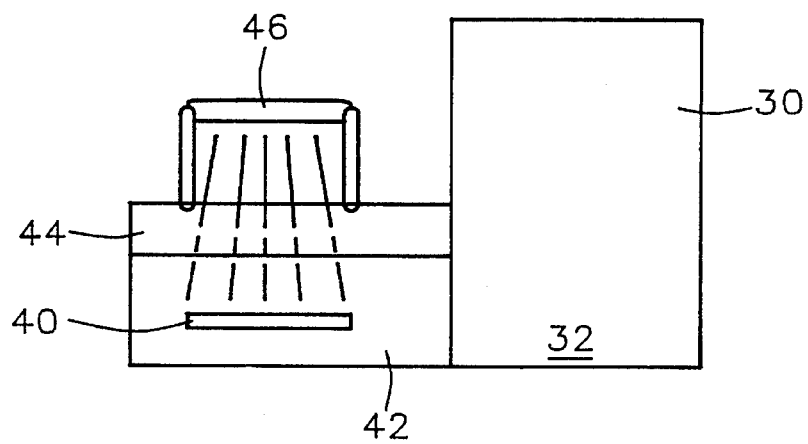
FIG. 3 shows a schematic view of an etcher having an etch chamber and an exit loading dock where the in situ hot bake of the present invention can be performed.

According to the present invention, a method for preventing the formation of a precipitate on the a substrate surface is presented. The term substrate is mean to include devices formed within a semiconductor wafer and the layers overlying the wafer. The term substrate surface is meant to include the upper most exposed layers on a semiconductor wafer. Although a simple structure is illustrated in the Figs., it will be appreciated that the present invention can be practiced on any type of semiconductor device or structure.

The figures are shown for illustration purposes only and are not meant to limit the scope of the invention. For example, not shown in FIG. 1 are various structures that formed in or on semiconductor substrate 8. Actual semiconductor devices will vary in their structure and complexity. Not shown are many elements, such as source, drain, gates, buried line, isolation etc. The process for preventing the formation of precipitates on titanium (Ti) containing substrate surfaces can be used in any suitable application on any semiconductor device.

An insulating layer 10 is formed on top of the substrate 8 surface. Insulating layer 10 can be formed of silicon oxide, borophosphosilicate glass or silicon nitride. Also, the insulating layer can be formed of a borophosphosilicate tetraethylorthosilicate oxide (BPTEOS) by depositing silicon oxide at 650° to 750° C. in a low pressure chemical vapor deposition reactor. Next, contact openings or via openings (vias) 16 are formed in the insulating layer 24. Afterwards, a barrier layer 12 containing titanium, such as titanium nitride (TiN), titanium (Ti), and titanium tungsten (TiW) is formed on the surface of a semiconductor substrate 10. The barrier layer can be formed by any conventional process sputtering or reactive sputtering technique. The barrier layer can have a thickness in the range of 800 to 1200 Å.

Next, a contact layer 14 is deposited on the surface of a semiconductor wafer. Contact layer 14 can be formed of tungsten or aluminum and is preferably formed of tungsten.

A tungsten contact layer can be formed using a conventional metal deposition process A contact layer 14 comprised of tungsten can be form in a conventional chemical vapor deposition (CVD) process using a reactant gas of $WF_6$. A contact layer 14 can have a thickness in the range of 5000 to 10,000 Å.

Then the contact layer 14 is etched back to form plugs 14a in the vias 16 as shown in FIG. 2. The etch back can be performed using a standard etch process, such as a $SF_6$ plasma etch. The etch back can be performed on a LAM Research Equipment etcher model 4720 with a $SF_6$ flow rates of about 150 sccm, a $N_2$ carrier, at temperature of about 40° to 50° C., and a pressure between about 250 to 400 mtorr and more preferably at a pressure of about 300 mtorr.

At this point, a precipitate 20 often appears on the substrate surface after the substrate is exposed to air (normally after several hours of exposure to air) as shown in FIG. 2. This precipitate 20 is often violet or brown in color and can cause serious yield and reliability problems. Also, the precipitate often appears to form a brown ring around the outside edge of the wafer. This precipitate can cause circuit failure by interfering with the metal and insulation layers formed over the barrier layer and precipitate. Also, the precipitate can cause a reliability problems such as electro migration, metal peeling, and metal bridging.

While the chemistry of the precipitate formation is not known for certain, it is theorized that the precipitate is the result of the following reaction mechanisms.

1) Contact layer etch back to the barrier layer containing Ti with a $SF_6$ plasma in an etcher.

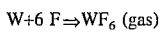

$W + 6 F \Rightarrow WF_6$ (gas)

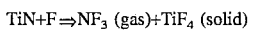

$TiN + F \Rightarrow NF_3$ (gas) + $TiF_4$ (solid)

2) $TiF_4$ will absorb moisture after exposing to the air and form $Ti(OH)F_3 + HF$

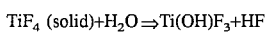

$TiF_4$ (solid) + $H_2O \Rightarrow Ti(OH)F_3 + HF$

3) $Ti^{4+}$ (a colorless ion) is reduced to $Ti^{3+}$ (violet ion) by W and acid through reduction-oxidation reactions.

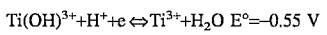

$Ti(OH)^{3+} + H^+ + e \Leftrightarrow Ti^{3+} + H_2O$  E°=−0.55 V

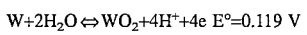

$W + 2H_2O \Leftrightarrow WO_2 + 4H^+ + 4e$  E°=0.119 V

4) $TiF_3$ will absorb moisture to form a stable complex precipitate

$TiF_3 + 6 H_2O \Rightarrow Ti(H2O)_6F_3$ (precipitate)

From this analysis of the chemical mechanisms involved, $TiF_4$, W, and $H_2O$ are thought to be the precursors to form the precipitate. The present invention was developed to remove the precursors ($TiF_4$ and the $H_2O$) of the precipitate ($Ti(H_2O)_6F_3$) from the wafer.

The present invention which prevents the formation of the precipitate is a hot bake process which is theorized to sublime the $TiF_4$ intermediate product thereby preventing the formation of the precipitate.

To remove the precursor of the precipitate, (e.g. thought to be $TiF_3$), the substrate is heated until the surface temperature of the substrate is between 100° C. and 200° C. and preferably about 120° C. and then maintaining the temperature for between 60 to 180 Seconds and preferably for about 90 seconds. The substrate can be heated with radiant heat, for example, with a halogen lamp with at power between 1000 to 2000 watts and preferably 1500 Watts.

As shown in FIG. 3, shows a schematic of the etcher 32 including the main chamber 30 and the exit loading dock 42. The contact layer 14 on the wafer 8 40 is etched back in the main etching chamber 30. After the etch, the wafer is transported from the main chamber 20 to the exit loading dock 42. The etch cycle time in the main chamber is depends on the etch back process, but is generally approximately 150 seconds. This allows the post etch back hot back process on the exit loading dock to take about 150 seconds without decreasing wafer through put. A lamp 46, preferably a 1500 Watt halogen lamp, is installed on top to the exit loading dock as shown in FIG. 3. The original polymethoyl methacrylate (PMMA) cover can be replaced by a quartz cover 44. This replacement is done because the quartz cover 44 can better withstand the high temperatures and allows more radiant energy through.

The wafer 40 is transported out of the etch chamber 30 to the exit loading dock 42 where the wafer is heated by the lamp 46. The temperature on the wafer surface can be increased to about 120° C. within about 20 seconds with the above described equipment. The total heating time for the wafer is between 60 to 200 seconds and preferably 100 seconds. The wafer is heated until the surface temperature of the substrate is between 100° C. and 200° C. and the temperature is maintained for between about 60 to 180 seconds. More preferably, the wafers are baked at about 120° C. for about 180 seconds.

Test show that the wafer that undergo the in situ hot bake process have no detectable precipitate within 10 hours of the in situ hot bake. The in situ hot bake can improve throughput and eliminates the precipitation after tungsten etch back. Use of the process present invention, also allows the user to eliminate other process modifications meant to eliminate the precipitate.

Figure 4:
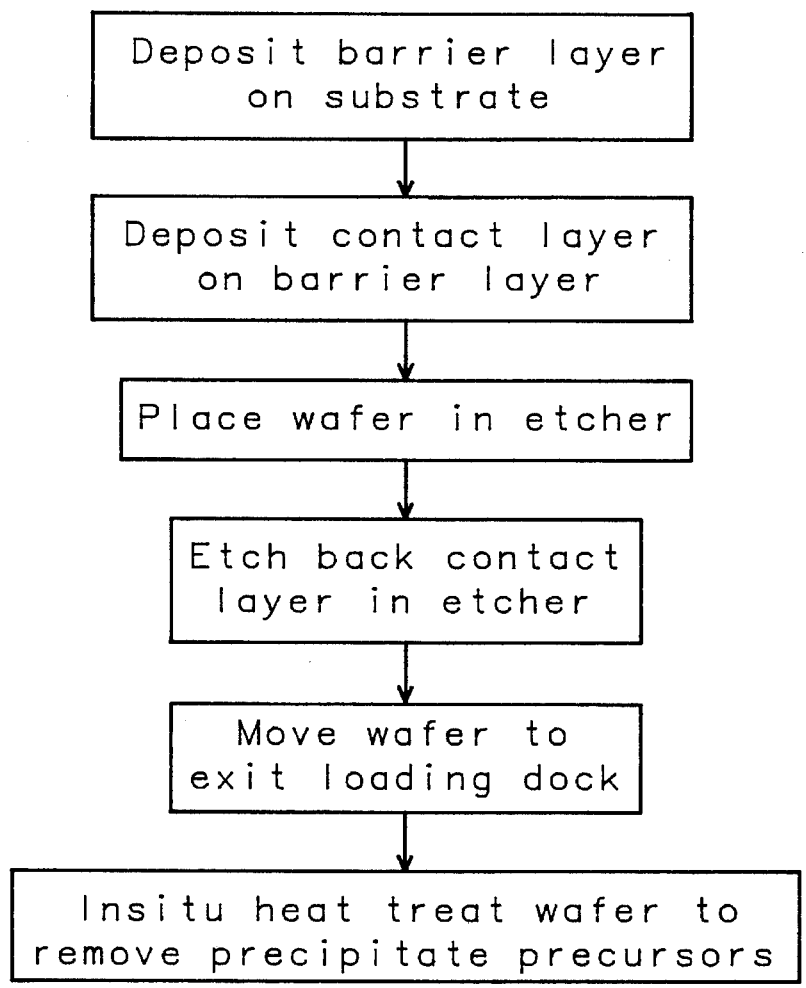
FIG. 4 shows a flow chart of the one embodiment of the process of the present invention.

Testing has shown that 150 second cycle time is sufficient for the post etch bake if the post bake is performed within about 4 hours of the completion of the contact layer etch back. The wafers are baked at a temperature between 100° to 200° C. and for between 60 and 180 seconds. More preferably, the wafers are baked at about 120° C. for 180 seconds. If appropriate this post bake process can be supplemented by additional processes to further remove the precursors or the precipitates. FIG. 4 shows a flow chart of the process of the invention.

After the baking of the wafers, a metal layer is deposited and patterned to form the interconnect layer. The time limit between baking the wafers and depositing the metal layer is between 10 to 12 hours and more preferably less than 10 hours.

The present invention can be utilized in any process where a titanium containing surface is exposed to a $H_2O$ containing environment. The etch back and baking processes may have to be optimized to the conditions of the device but the invention is applicable across a wide range of devices and device structures which include a titanium containing layer. The in situ hot bake can improve throughput and eliminates the precipitation after tungsten etch back. Use of the process present invention, also allows the user to eliminate other process modifications meant to eliminate the precipitate problem.

While the invention has been particularly shown and described with reference to the preferred embodiments thereof, it will be understood by those skilled in the art that various changes in form and details may be made without departing from the spirit and scope of the invention.

What is claimed is:

1. A method of preventing the formation of precipitates on a substrate surface after a contact layer etch back step, the method comprising the steps of:

depositing a barrier layer containing titanium on the surface of the substrate, depositing a contact layer over said barrier layer and over the surface of the substrate, etching back said contact layer and exposing portions of the barrier layer; and thereafter heating said substrate and exposed portions of said barrier layer with radiant heat until the surface temperature of said substrate is between 100° C. and 200° C. and maintaining the temperature for between about 60 to 180 seconds.

2. The method of claim 1 wherein the heating of the substrate is achieved by a halogen lamp with a power between 1000 and 2000 Watts.

3. The method of claim 1 wherein the etching is performed in an etcher that includes an etch chamber and an exit loading dock, the exit loading dock including a heating lamp, the substrate transported from said etch chamber to said exit loading dock where said substrate is heated with said heating lamp.

4. The method of claim 1 wherein said barrier layer containing titanium is comprised of a material selected from the group of titanium nitride, titanium, and titanium tungsten.

5. The method of claim 1 wherein said contact layer is formed of a material selected from the group consisting of tungsten and aluminum.

6. The method of claim 1 wherein said contact layer has a thickness in the range of 5000 to 10,000 Å.

7. The method of claim 1 wherein the etching back of the contact layer is performed in a plasma etcher at a temperature in the range of about 40° to 50° C., at a pressure between about 250 and 400 mtorr, and with $SF_6$ and $N_2$ gasses.

8. The method of claim 1 wherein the heating of the substrate is performed within about 4 hours of the etching of the contact layer.

9. The method of claim 1 wherein the method further includes forming an interconnect layer on the substrate surface after the heating of the substrate.

10. The method of claim 1 wherein the method further includes forming an interconnect layer on the substrate surface after the heating of the substrate, the interconnect layer formed within 12 hours of the heating of the substrate.

11. A method of preventing the formation of precipitates on a substrate surface after a tungsten contact layer etch back step, the method comprising the steps of:

depositing a titanium nitride barrier layer on the surface of the substrate, depositing a tungsten contact layer over said titanium nitride barrier layer and over the surface of a semiconductor wafer, etching back said tungsten contact layer in an etcher exposing portions of said titanium nitride barrier layer; said etcher including an etch chamber and an exit loading dock, the exit loading dock including a heating lamp, moving the substrate from the etcher chamber to the exit loading dock heating the substrate and exposed portions of said titanium nitride barrier layer with radiant heat with said heating lamp, until the surface temperature of the substrate is between 100° C. and 200° C. and maintaining the temperature for between about 60 to 180 seconds.

12. The method of claim 11 wherein the heating of the substrate is achieved by a halogen lamp with a power between 1000 to 2000 Watts.

13. The method of claim 11 wherein said tungsten contact layer has a thickness in the range of 5000 to 10,000 Å.

14. The method of claim 11 wherein the etching back of the tungsten contact layer is performed in a plasma etcher at a temperature in the range of about 40° to 50° C., at a pressure between about 250 and 400 mtorr, and with $SF_6$ and $N_2$ gasses.

15. The method of claim 11 wherein the baking of the substrate is performed within about 4 hours of the etching of the contact layer.

16. The method of claim 11 wherein the method further includes forming an interconnect layer on the substrate surface after the heating of the substrate.

17. The method of claim 11 wherein the method further includes forming an interconnect layer on the substrate surface after the heating of the substrate, the interconnect layer formed within 12 hours of the heating of the substrate.

18. A method of preventing the formation of precipitates on a substrate surface after a tungsten contact layer etch back step, the method comprising the steps of:

depositing a titanium nitride barrier layer on the surface of said substrate;

depositing a tungsten contact layer over said titanium nitride barrier layer and over said substrate surface;

etching back said tungsten contact layer in a plasma etcher exposing portions of said titanium nitride barrier layer; said plasma etcher including an etch chamber and an exit loading dock, said exit loading dock including a heating lamp, said etch back is performed in said plasma etcher with a fluorine gas;

moving said substrate from said etcher chamber to said exit loading dock;

heating said substrate and exposed portions of said titanium nitride barrier layer with radiant heat using said heating lamp, until the surface temperature of said substrate is between 100° C. and 200° C. and maintaining the temperature for between about 60 and 180 seconds; the heating of said substrate is performed within 4 hours of said etching of said tungsten contact layer.

19. The method of claim 18 wherein the heating of the substrate is achieved by a halogen lamp with a power between about 1000 and 2000 Watts.

20. The method of claim 18 wherein said tungsten contact layer has a thickness in the range of about 5000 to 10,000 Å.

21. The method of claim 18 wherein the etching back of the tungsten contact layer is performed in a plasma etcher at a temperature in the range of between about 40° and 50° C. and at a pressure between about 250 and 400 mTorr; and with $SF_6$ and $N_2$ gasses.

22. The method of claim 18 wherein the method further includes forming an interconnect layer on the substrate surface after the heating of the substrate.

23. The method of claim 18 wherein the method further includes forming an interconnect layer on the substrate surface after the heating of the substrate, and said interconnect layer is formed within 12 hours of the heating of the substrate.

* * * * *